United States Patent [19]

Stein

[11] Patent Number: 4,823,605

[45] Date of Patent: Apr. 25, 1989

[54] SEMICONDUCTOR PRESSURE SENSOR WITH CASING AND METHOD FOR ITS MANUFACTURE

[75] Inventor: Karl-Ulrich Stein, Unterhaching, Fed. Rep. of Germany

[73] Assignee: Siemens Aktiengesellschaft, Berlin and Munich, Fed. Rep. of Germany

[21] Appl. No.: 151,371

[22] Filed: Feb. 2, 1988

[30] Foreign Application Priority Data

Mar. 18, 1987 [DE] Fed. Rep. of Germany ....... 3708831

[51] Int. Cl.[4] ............................ G01L 7/08; G01L 9/06
[52] U.S. Cl. .................................... 73/727; 29/621.1; 73/706; 338/4
[58] Field of Search ................... 73/727, 721, DIG. 4, 73/706; 29/610 SG; 338/4, 42; 128/675, 748

[56] References Cited

U.S. PATENT DOCUMENTS

| 4,274,423 | 6/1981 | Mizuno et al. | 128/675 |
| 4,322,980 | 4/1982 | Suzuki et al. | 73/727 |
| 4,658,651 | 4/1987 | Le | 73/727 |
| 4,732,042 | 3/1988 | Adams | 73/706 |

FOREIGN PATENT DOCUMENTS

| 77933DE | 8/1987 | European Pat. Off. |
| 3200448 | 1/1982 | Fed. Rep. of Germany. |
| 206091 | 6/1984 | Japan. |

OTHER PUBLICATIONS

"Une Nouvelle Technologie Pour Les Capteurs de Pression"; No. 474, May 1982; by J. P. Delaporte; pp. 23-25.

"An Update On The Integration of Silicon Pressure Sensors"; Nov. 19-22, 1985; by Randall K. Frank and Wendell E. McCulley; pp. 1-5.

"Silizium-Drucksensoren Fuer den Bereich 2kPa bis 40 MPa"; 1985, by Josef Binder, Klaus Becker and Guenter Ehrler; pp. 64-67.

Silizium-Relativdrucksensoren fuer den Niederdruckbereich bis 50 kPa (500 mbar), 1984; pp. 285 and 286.

Primary Examiner—Donald O. Woodiel
Attorney, Agent, or Firm—James G. Morrow

[57] ABSTRACT

A semiconductor pressure sensor and method for its manufacture. Preferably, the pressure sensor is used as an absolute pressure sensor. The pressure sensor includes a pressure sensor chip of semiconductor material, the pressure sensor chip including a piezoresistive diaphragm. The pressure sensor is arranged in a casing which has an aperture for transmitting the ambient pressure to the diaphragm of the pressure sensor chip. The pressure sensor chip is fastened on a conductive tape and the conductive tape is a component of the casing. The casing consists of a hard synthetic material and contains the pressure sensor chip. The casing is configured so that the method of manufacture and tooling for manufacture allow cost-efficient production. The casing also offers protection for the pressure sensor during testing, equipping and during application in a circuit. The pressure sensor also includes a soft elastic material for covering the pressure sensor chip and transmitting ambient pressure from the aperature to the diaphragm.

6 Claims, 1 Drawing Sheet

SEMICONDUCTOR PRESSURE SENSOR WITH CASING AND METHOD FOR ITS MANUFACTURE

BACKGROUND OF THE INVENTION

1. Field of Invention

This invention relates to a pressure sensor, and more particularly to a semiconductor pressure sensor for sensing absolute pressure.

2. Description of Related Art

In the field of pressure meters, semiconductor pressure sensors are increasingly being used more frequently. In known pressure sensors, for example, sensors for sensing relative pressure, a silicon diaphragm forms the core of the component, in which, through ion implantation, resistive paths are generated. If pressure is exerted on the diaphragm, it is mechanically depressed. The pressure exerted on the diaphragm causes resistive changes in the diaphragm due to piezoresistive effects. The piezoresistive effects are utilized in order to convert physical pressure into an analog electrical signal. Pressure sensor chips can be built into casings which consist of metal and have an aperture in the cover for transmitting the ambient pressure to the pressure-sensitive chip surface. Such casings are relatively expensive and cumbersome.

SUMMARY OF THE INVENTION

It is, therefore, an object of this invention to provide a pressure sensor having plastic plug-in casings and plastic miniature casings for surface mounting. Another object of this invention is to provide a pressure sensor with a casing which can be manufactured cost-efficiently. Additionally, the casing preferably offers protection for the pressure sensor during testing, equipping and during application in a circuit.

Accordingly, there is provided a pressure sensor comprising a pressure sensor chip of semiconductor material fastened on a conductor tape, the chip including a piezoresistive diaphragm; a casing for containing the pressure sensor chip and piezoresistive diaphragm, the casing defining an aperture for allowing the ambient pressure to communicate with the diaphragm of the pressure sensor chip, the conductor tape being a component of the casing; and an elastic material for covering a portion of the diaphragm and transmitting pressure to the diaphragm.

Such a pressure sensor is particularly useful for sensing absolute pressure, since only the ambient pressure acting on the casing is compared to a vacuum in the interior of the pressure sensor chip is measured.

One advantage of the invention is that an absolute pressure sensor can be manufactured through the additional step of applying a soft elastic covering of suitable quality and dimensions but otherwise standard technology.

Another advantage of the pressure sensor is that a pressure sensor chip can be packaged in a standard plastic plug-in casing or standard plsatic miniature casing and the ambient pressure can act upon the pressure-sensitive chip surface through the soft elastic covering. The aperture in the hard plastic casing exposes the soft plastic covering to ambient pressure. Still another advantage of the pressure sensor is that the casing design contains a standard conductor tape as a system carrier for one of the standard casings.

Various other objects and advantages of the pressure sensor embodying the present invention will become apparent from the following description, with reference to the accompanying drawing.

DETAILED DESCRIPTION OF THE PREFERRED EMBODIMENT

Figure 1:
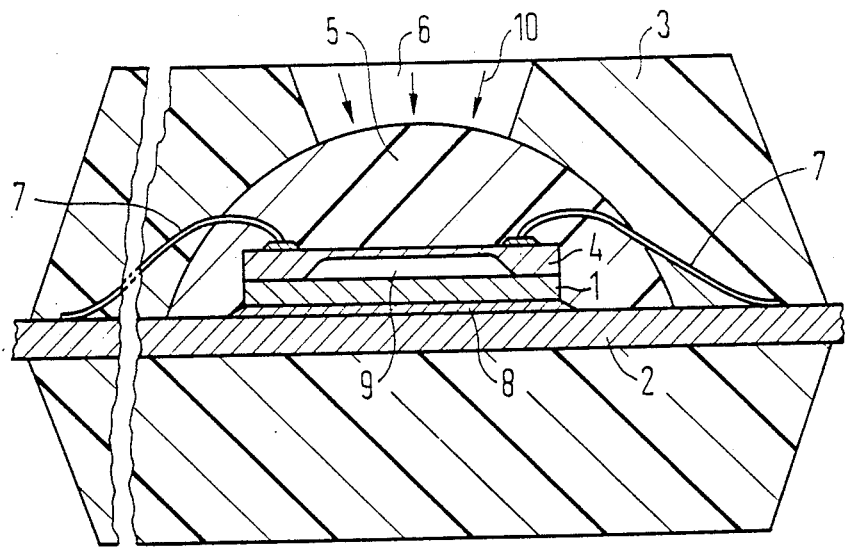
FIG. 1 is a cross-sectional view of the pressure sensor and casing.

Turning now to FIG. 1, the pressure sensor chip 1 consists of semiconductor material, preferentially of silicon, and has a piezoresistive diaphragm part 4. Resistance bridges in the diaphragm part 4, which provide the piezoresistive properties of the semiconductor structural part, are preferentially generated through ion implantation. The pressure sensor chip 1 is fastened directly on the conductor tape 2, which is a component of the casing 3. The pressure sensor chip 1 can be fastened to the conductor tape 2 with a fastening layer 8 through a soldering process.

In this embodiment of the invention, after applying the pressure sensor chip 1 to the conductor tape 2, the chip 1 is enclosed by a soft elastic covering 5. Preferably, the interior space of casing 3 is filled with the covering 5. By way of example, the covering 5 can be a silicon gel applied by a drip method known in semiconductor technology. The cover 5 completely covers the pressure sensor chip 1 and diaphragm part 4. A hollow space or void 9 is formed between the diaphragm part 4 and the sensor chip 1. When the pressure sensor is used as an absolute pressure sensor, the hollow space 9 is evacuated.

Subsequently, the gel 5 is coated with a duroplastic casing 3 so that the ambient pressure can act upon the soft plastic covering 5. The casing 3 includes an aperture 6 for transmitting the ambient pressure onto the diaphragm part 4 of the pressure sensor chip 1. The arrows 10, shown in FIG. 1, generally indicate the direction in which the ambient pressure acts upn the diaphragm part 4 through the aperture 6. The diaphragm part 4 of the pressure sensor chip 1 is connected with the conductor tape 2 through wires 7, for example aluminum bond wires.

While one embodiment of a pressure sensor has been shown and described in detail herein, various other changes and modifications may be made without departing from the scope of the present invention. For example, the soft elastic material 5 can be formed such that it also occupies the aperture 6. Through suitable selection of the materials for hard coating and soft elastic material, the configuration of the elastic material 5 can be extensively modified. For example, given an appropriate choice of materials for the soft elastic material, this material can be at least partially removed in an etching or solution process.

I claim:

1. A pressure sensor comprising:
   a pressure sensor chip of semiconductor material fastened on a conductor tape, the chip including a piezoresistive diaphragm;
   a casing for containing the pressure sensor chip and piezoresistive diaphragm, the casing defining an aperture for allowing the ambient pressure to communicate with the diaphragm of the pressure sensor chip, the conductor tape being a component of the casing; and an elastic material for covering a portion of the diaphragm and transmitting pressure to the diaphragm.

2. The pressure sensor of claim 1, wherein the pressure sensor chip consists of silicon and the diaphragm is ion implanted.

3. The pressure sensor of claim 2, wherein the elastic material is a silicon gel.

4. The pressure sensor of claim 3, wherein the casing is fabricatd from a duroplastic material.

5. The pressure sensor of claim 3, wherein the pressure sensor chip and diaphragm cooperate to form an evacuated void.

6. A method for manufacturing a pressure sensor comprising the steps of:
   bonding a pressure sensor chip including a diaphragm to a conductor tape;
   covering the pressure sensor chip with an elastic material; and
   coating the elastic material with a duroplastic to form a casing having an aperture, the aperture allowing the diaphragm to communicate with the ambient pressure.

* * * * *